(12) United States Patent
Park et al.

(10) Patent No.: US 7,332,406 B2
(45) Date of Patent: *Feb. 19, 2008

(54) AIR GAP INTERCONNECT STRUCTURE AND METHOD

(75) Inventors: Hyun-Mog Park, Beaverton, OR (US); Grant M. Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 317 days.

This patent is subject to a terminal disclaimer.

(21) Appl. No.: 10/986,414

(22) Filed: Nov. 10, 2004

(65) Prior Publication Data

US 2005/0106852 A1 May 19, 2005

Related U.S. Application Data

(62) Division of application No. 10/301,956, filed on Nov. 21, 2002, now Pat. No. 6,861,332.

(51) Int. Cl.
*H01L 21/76* (2006.01)
(52) U.S. Cl. ............... 438/422; 438/619; 257/E21.581
(58) Field of Classification Search .............. 438/411, 438/421–422, 619, 624; 257/E21.573, E21.581
See application file for complete search history.

(56) References Cited

U.S. PATENT DOCUMENTS 6,071,805 A      6/2000   Liu
6,165,890 A     12/2000   Kohl et al.
6,413,852 B1     7/2002   Grill et al.
6,448,177 B1     9/2002   Morrow et al.
6,555,467 B2 *   4/2003   Hsu et al. ................ 438/633
6,861,332 B2 *   3/2005   Park et al. ............... 438/421
2002/0158337 A1 10/2002   Babich et al.

OTHER PUBLICATIONS

Tetsuya Ueda, et al., "A novel air gap integration scheme for multi-level interconnects using self-aligned via plugs," 1998 Symposium on VLSI Technology—Digest of Technical Papers, Jun. 9-11, 1998, IEEE, pp. 46-47.

Paul A. Kohl, et al., "Air-gaps in 0.3/spl mu/ m electical interconnections," IEEE Electron Device Letters, vol. 21, Issue 12, Dec. 2000, pp. 557-559.

* cited by examiner

*Primary Examiner*—Thanhha S. Pham
(74) *Attorney, Agent, or Firm*—Blakely, Sokoloff, Taylor & Zafman LLP

(57) ABSTRACT

A low-k dielectric sacrificial material is formed within a microelectronic structure covered with a layer defining an exhaust vent. At an appropriate time, the underlying sacrificial material is decomposed and exhausted away through the exhaust vent. Residue from the exhausted sacrificial material accumulates at the vent location during exhaustion until the vent is substantially occluded. As a result, an air gap is created having desirable characteristics as a dielectric.

20 Claims, 9 Drawing Sheets

AIR GAP INTERCONNECT STRUCTURE AND METHOD

This Is a divisional patent application of U.S. patent application Ser. No. 10/301,956, filed Nov. 21, 2002 now U.S. Pat. No. 6,861,332, which is presently pending and is assigned to the assignee of the present invention.

BACKGROUND OF THE INVENTION

Low dielectric constant materials are used as interlayer dielectrics in microelectronic devices, such as semiconductor devices, to reduce the RC delay and improve device performance. As device sizes continue to shrink, the dielectric constant of the material between metal lines must also decrease to maintain the improvement. Certain low-k materials have been proposed, including various carbon-containing materials such as organic polymers and carbon-doped oxides. Although such materials may serve to lower the dielectric constant, they may offer inferior mechanical properties such as poor strength and low fracture toughness. The eventual limit for a dielectric constant is k=1, which is the value for a vacuum. Methods and structures have been proposed to incorporate void spaces or "air gaps" in attempts to obtain dielectric constants closer to k=1. One major issue facing air gap technology is how to remove sacrificial material to facilitate multi-layer structures. Another major issue facing air gap technology is how to facilitate air gap creation while providing a structure which can withstand modern processing steps, such as chemical-mechanical polishing and thermal treatment, as well as post processing mechanical and thermo-mechanical rigors.

Accordingly, there is a need for a microelectronic device structure incorporating air gaps which has low-k dielectric properties, can be used in multi-layer structures, and has acceptable mechanical characteristics during and after processing.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
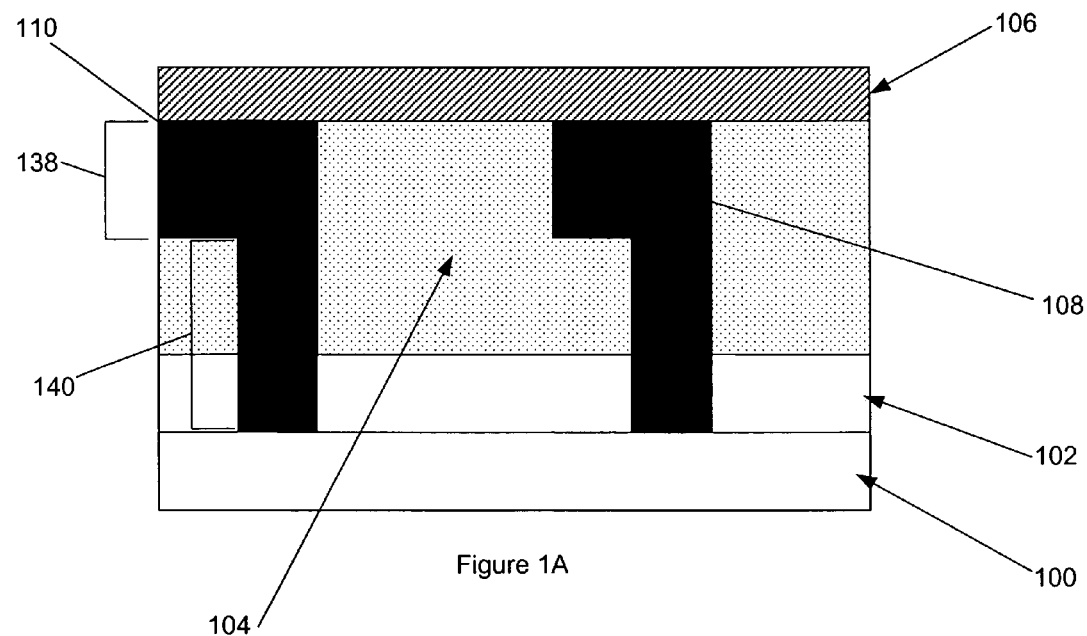
FIGS. 1A-1I depict cross-sectional views of various aspects of an embodiment of the present invention wherein a sacrificial dielectric layer is decomposed to form a volatile gas which forms deposits around an exhaust vent, the deposits at least partially occluding the exhaust vent.

Referring to FIG. 1A, a cross-sectional view of a microelectronic structure is shown having a substrate layer (100) adjacent a first dielectric layer (102), which is depicted adjacent a sacrificial dielectric layer (104). The sacrificial dielectric layer (104), selected for its relatively low dielectric constant, controllable dissolution or decomposition characteristics, compatibility with adjacent materials, and mechanical properties, is positioned between the first dielectric layer (102) and a second dielectric layer (106) in one direction, and between two conductive layers (108, 110) in a substantially perpendicular direction, as is convention for semiconductor interconnect structures. Relatively simple structures such as the one depicted in FIG. 1A are well known in semiconductor processing, and are produced using conventional techniques, depending upon the materials selected.

The substrate layer (100) may be any surface generated when making an integrated circuit, upon which a conductive layer may be formed. The substrate layer (100) thus may comprise, for example, active and passive devices that are formed on a silicon wafer, such as transistors, capacitors, resistors, diffused junctions, gate electrodes, local interconnects, etcetera. The substrate layer (100) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers.

A first dielectric layer (102) may be integrated to protect, isolate, and/or provide etch stop functionality adjacent the substrate layer (100). Referring to FIG. 1A, the first dielectric layer (102) preferably comprises a material, such as silicon nitride or other known etch stop material appropriately matched with the etchability of adjacent layers, which selectively does not substantially etch when the layer above (104) is being etched. Other ceramic and glass materials conventionally employed as etch stops also are suitable, and materials for the first dielectric layer (102) preferably have thermal decomposition temperatures higher than about 500 degrees, Celsius. The first dielectric layer (102) may be deposited using conventional chemical vapor deposition ("CVD"), plasma enhanced CVD, or low-pressure CVD techniques, as are well known in the art, in a layer preferably a thickness between about 10 nanometers and about 200 nanometers.

The sacrificial dielectric layer (104), depicted in FIG. 1A between the first dielectric layer (102) and the second dielectric layer (106), is denominated "sacrificial" because it is selected for removability, at least in part, from the volume it occupies as depicted in FIGS. 1A-1D. The sacrificial layer (104) preferably has a thickness between about 10 nanometers and about 2,000 nanometers. Preferred sacrificial dielectric layers comprise organic polymeric materials including but not limited to polynorbornene; cross-linked photoresist; photosensitive polyimide; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. Polyarylene-based materials, such as SiLK™, and poly(aryl ether)-based materials, such as FLARE™, may have thermal decomposition temperatures of about 450 degrees Celsius. Variants of polynorbornene and polyimide, which generally have a thermal decomposition temperature of about 400 degrees Celsius, are available from suppliers such as Tokyo Ohka Kogyo Corporation and JSR Corporation. As would be apparent to one skilled in the art, photoresist may comprise a polynorbornene polymer backbone with photo-acid generating groups ("PAGs") based on phenyl-sulfonates which are tuned to specific wavelengths of radiation by adding various substituents, while photosensitive polyimide may comprise a polyimide backbone with appropriate PAGs. The sacrificial dielectric layer (104) may be formed using conventional deposition techniques such as spin-on for suitable polymers, conventional CVD, or physical vapor deposition ("PVD").

Referring to FIG. 1A, each of the conductive layers (108, 110), comprising materials conventionally used to form conductive layers in integrated circuits, and preferably comprising metals such as copper, aluminum, and alloys thereof, is formed using known techniques. For example, the depicted conductive layers (108, 110) may be formed using known dual damascene techniques, wherein a trench is formed using conventional lithography, etching, and cleaning techniques, the trench having a via portion (140) and a line portion (138). The trench may then be lined with a barrier layer (not shown) to isolate conductive material, after which the trench is filled with a conductive material using, for example, known electroplating, electroless plating, chemical vapor deposition, or physical deposition techniques, to form the conductive layers (108, 110) shown. Alternatively, the conductive layers (108, 110) may be formed using known subtractive metallization techniques, wherein a larger layer of conductive material is etched away to form conductive layers which are electrically isolated from one another, as are the specimens depicted in FIG. 1A. The resultant interconnect structure has conductive layers (108, 110) positioned between the sacrificial dielectric layer (104). Alternatively, conductive layers (108, 110) may be made from doped polysilicon or a silicide, e.g., a silicide comprising tungsten, titanium, nickel, or cobalt, using known techniques. The conductive layers (108, 110) preferably have line widths between about 10 nanometers and about 2,000 nanometers. The spacing between the conductive layers (108, 110) may vary with the feature size of the microelectronic structure as would be apparent to one skilled in the art, and is related to the volume of sacrificial material per each exhaust vent, as is discussed below in reference to FIG. 1G. Preferably the spacing is between about 20 nanometers and about 1,000 nanometers. Depending upon the selected conductive material, a shunt layer may be formed over the conductive layers using conventional techniques and materials, to isolate the conductive layers from subsequent treatments and materials. With copper metal conductive layers, a metal shunt layer comprising, for example, cobalt or tungsten, is effective for isolating the copper. The shunt material (not shown) is deposited using conventional techniques such as chemical vapor deposition, subsequent to a planarization using known techniques such as chemical-mechanical planarization (hereinafter "CMP"). Shunt material deposited upon the exposed portions of the sacrificial dielectric layer (104) may be removed using subsequent CMP or etch back, as would be apparent to those skilled in the art.

Subsequent to formation of the conductive layers (108, 110), a second dielectric layer (106) is formed. Preferably the second dielectric layer (106) is not a "sacrificial" layer, in that it remains substantially intact during subsequent decomposition or dissolution and removal treatments which modify the sacrificial dielectric layer (104), with the exception that an exhaust vent, as described in further detail below, may be defined across the second dielectric layer (106) to facilitate removal of portions of the sacrificial dielectric layer (104). The second dielectric layer (106) preferably comprises a material, such as silicon nitride other known etch stop material appropriately matched with the etchability of adjacent layers, which selectively does not substantially etch when a subsequently-formed layers is being etched. Other suitable materials include but are not limited to silicon carbide, silicon dioxide, carbon doped oxides, as further described below, and other ceramics or amorphous glasses, such as aluminosilicate, which have relatively high thermal decomposition temperatures in the ranges over 500 degrees Celsius. The high thermal decomposition temperatures of preferred materials for the second dielectric layer (106) facilitate thermal decomposition and removal of associated sacrificial materials without thermal decomposition of the second dielectric layer (106). The second dielectric layer (106) may be deposited using conventional chemical vapor deposition ("CVD"), plasma enhanced CVD, or low-pressure CVD techniques, as are well known in the art. The second dielectric layer (106) is preferably between about 10 nanometers and about 500 nanometers in thickness.

Figure 1B:
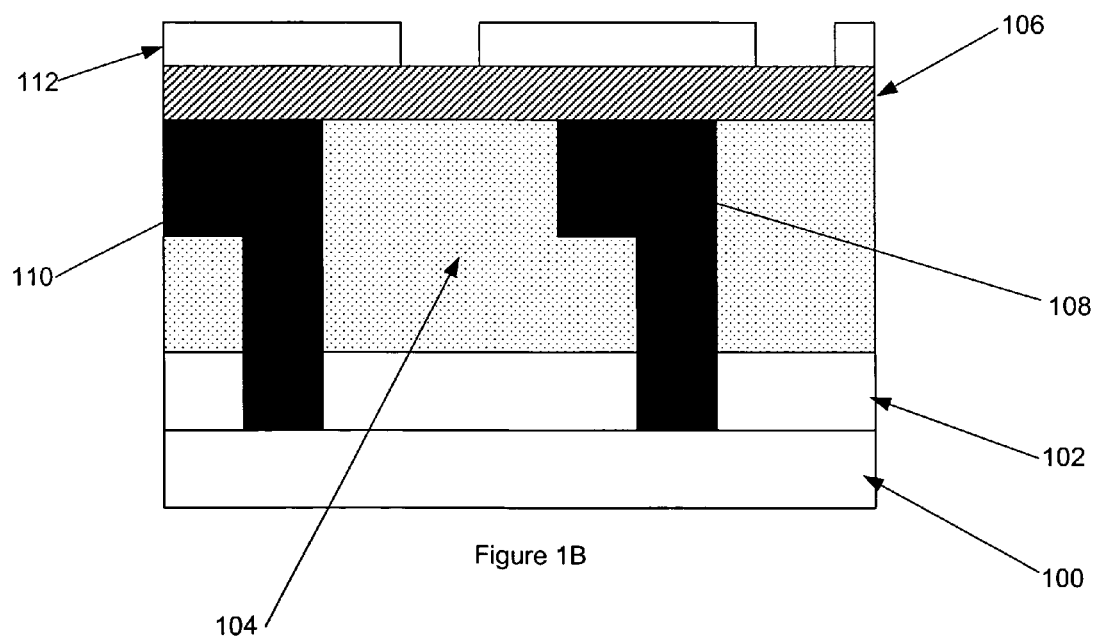
Figure 1C:
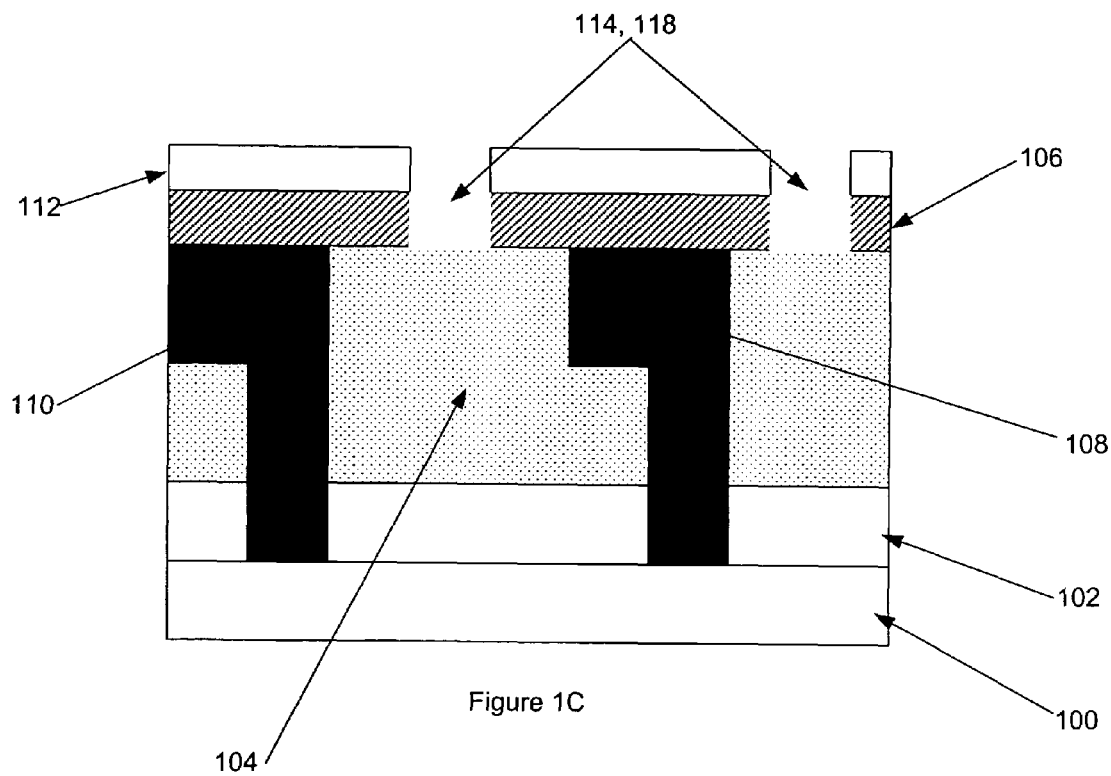
Figure 1D:
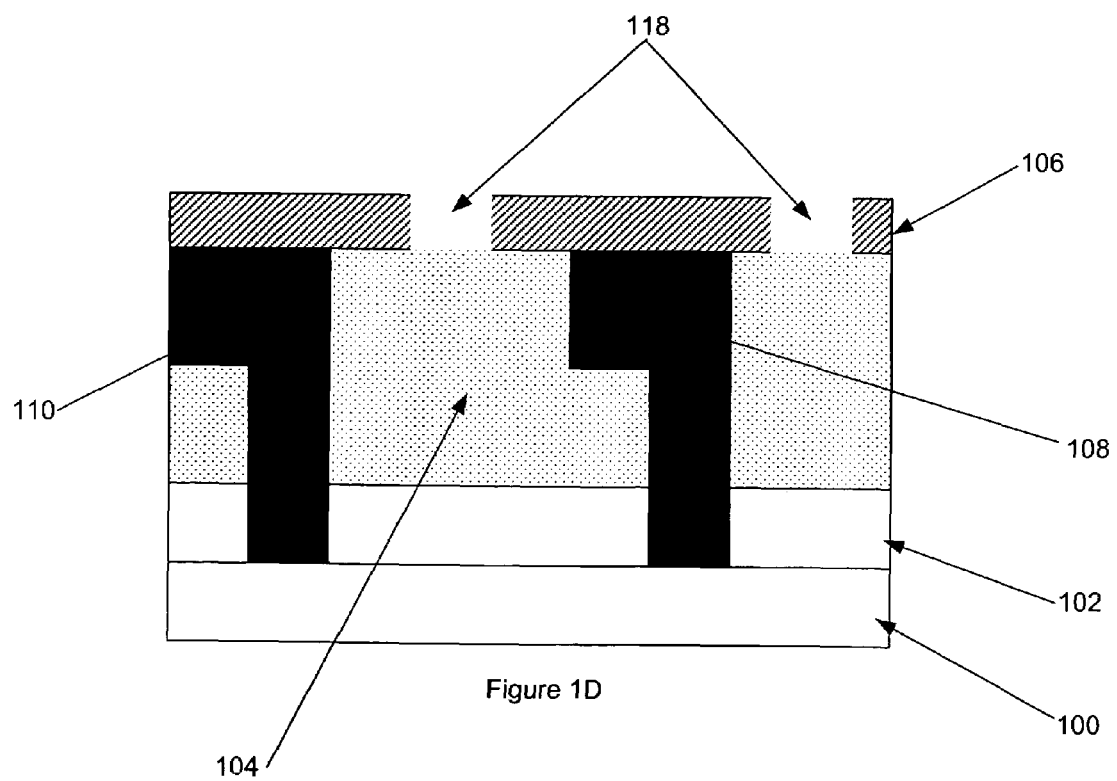

Referring to FIG. 1B, a structure similar to that depicted in FIG. 1A is shown, with the exception that an etching pattern layer (112) has been formed adjacent the second dielectric layer (106), the etching pattern layer (112) preferably comprising conventional photoresist material formed and patterned using known lithography techniques. Referring to FIG. 1C, trenches (114) are etched to the sacrificial dielectric layer (104) employing the etching pattern layer (112) and appropriately selective etching techniques, such as conventional acid-based wet etching or plasma-enhanced dry etching. The trenches (114) define exhaust vents (118), which may be used to facilitate removal of portions of the sacrificial dielectric layer (104), as described below. As shown in FIG. 1D, the etching pattern layer (112) previously depicted in FIG. 1C has been removed, preferably using known ashing or polishing techniques, leaving the second dielectric layer (106), with exhaust vents (118) defined therethrough, exposed. In another embodiment, the etching pattern layer (112) is left intact to be ashed during a subsequent thermal decomposition treatment, described below, to streamline the overall process.

Figure 1E:
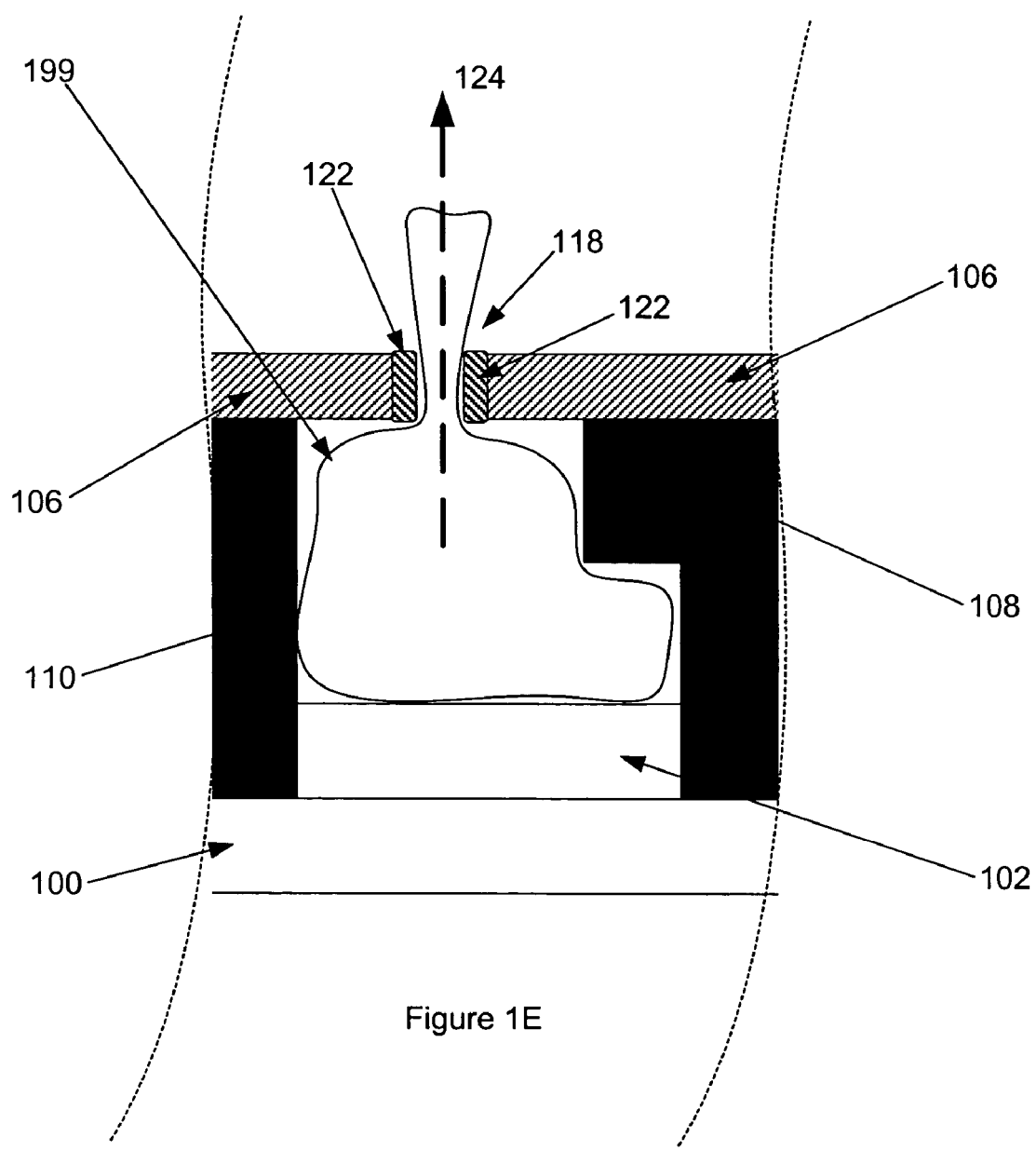
Figure 1F:
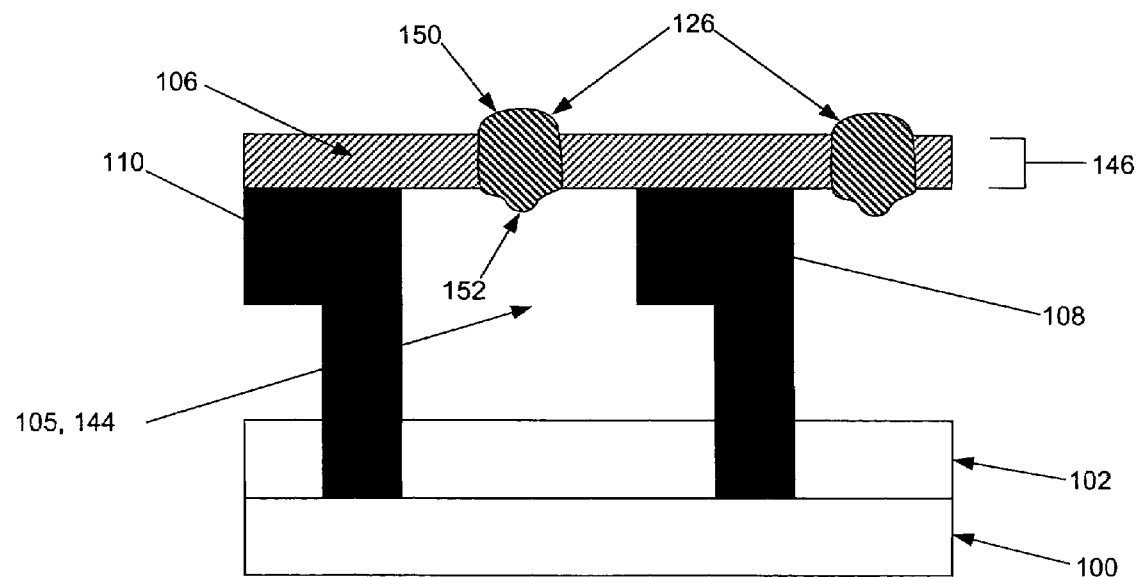

Referring to FIG. 1E, a closer cross-sectional view of the microelectronic structure is depicted wherein a transformation is partially depicted. As shown in FIG. 1E, a volatile gas (199), comprising at least a portion of the sacrificial dielectric layer (104 in FIGS. 1A-1E) in thermally decomposed form, escapes through an exhaust vent (118) along an escape pathway (124) defined by the exhaust vent (118). As the volatile gas passes by the portions of the second dielectric layer (106) which define the exhaust vent (118), residue (122) accumulates. The accumulated residue (122) decreases the size of the exhaust vent (118), eventually forming a plug (126), as depicted in FIG. 1F. The plug (126) isolates the void (144) from the environment opposite the second dielectric layer (106) by at least partially, and preferably substantially completely occluding, or blocking, the exhaust vent to a degree enabling subsequent layers to be deposited upon the surface defined by the plug (126) and second dielectric layer (106) without substantial infilling of the adjacently positioned air gap or void (144). The fit or seal provided between the plug (106) and second dielectric layer (106) need not be perfect or hermetic to achieve this objective, given the viscosity, particle size, and other relevant properties of materials commonly used in such positions. As shown in FIG. 1F, the result is a void (144)

confined cross-sectionally by the substrate layer (100) or first dielectric layer (102), the conductive layers (108, 110), the second dielectric layer (106), and the plug (126).

Thermal processing is a critical aspect to the successful formation of structures like those depicted in FIGS. 1E and 1F. In particular, at least a portion of the intact sacrificial dielectric layer (104), as shown in FIG. 1D, must be decomposed without substantial decomposition of surrounding structures such as the first and second dielectric layers (102, 106), barrier layers which may be present (not shown), or adjacent conductive layers (108, 110). Generally this is accomplished by selecting a sacrificial dielectric layer material having a lower thermal decomposition temperature threshold than suitable materials for surrounding structures, to enable heating past the decomposition temperature of the sacrificial dielectric layer material, which also is below the thermal decomposition thresholds for adjacent materials. The aforementioned preferred sacrificial dielectric materials, for example, have thermal decomposition temperatures between about 400 and about 450 degrees Celsuis, while the preferred second dielectric layer materials thermally decompose at temperatures above 500 degrees Celsius. The result of thermally decomposing at least a portion of the sacrificial dielectric layer (104) is a gas phase dielectric decomposition. When combined with a carrier plasma (not shown), such as an oxygen, hydrogen, or nitrogen rich plasma, as are known in the art for their reactivity and/or ability to act as carriers, a volatile gas (199) may be formed from the gas phase dielectric decomposition and carrier plasma, which deposits residue (122) around an exhaust vent (118) when exhausted through such a vent during a process of cooling from the temperature of formation of the volatile gas, substantially the same as the decomposition temperature for the material comprising the sacrificial dielectric layer (104), to room temperature, or about 25 degrees Celsius. Cooling the environment around the volatile gas preferably occurs by removing the heated structure, including the volatile gas, from heating chamber and exposing it to room temperature. In other words, taking such a structure out of the oven and into a laboratory atmosphere generally is enough of a temperature transformation to cause high-speed exhausting of the volatile gas (199) through the exhaust vent (118), as residue (122) is concomitantly formed into a plug (126), and at least one air gap or void (144) occupying the volume (105) previously occupied by the intact sacrificial dielectric layer (104) is defined. As is further described below, the embodiment of the exhaust vent depicted in FIGS. 1D and 1G, for example, defines a substantially cylindrical geometry. With this exhaust geometry, the plug (126), as shown in FIG. 1F, preferably has a substantially cylindrical shape where confined by the second dielectric layer (106), and may have a substantially convex top surface (150) and a stem-shaped bottom surface (152) due to the deposition pattern of the exhausting volatile gas. The plug (126) and residue (122) preferably comprise the same material as the sacrificial dielectric layer (104), although modifications may occur during the carrier plasma treatment depending upon locally available precursors, as would be apparent to one skilled in the art.

As shown in FIG. 1F, a plug (126) may have a greater thickness than that (146) of the associated second dielectric layer (106). Such a geometric discrepancy subsequently may be remedied with known planarization techniques, such as CMP, before or after formation of additional adjacent layers. Additional layers preferably are formed upon the second dielectric layer (106) and plug (126) before any planarization of the plug (126), since one of the primary reasons for forming a plug (126) is to establish a subsequent layer above an air gap (144), and planarization may cause the plug (126) to be repositioned in an orientation or position unfavorable in terms of subsequent layer formation and retention of the air gap (144).

Figure 1G:
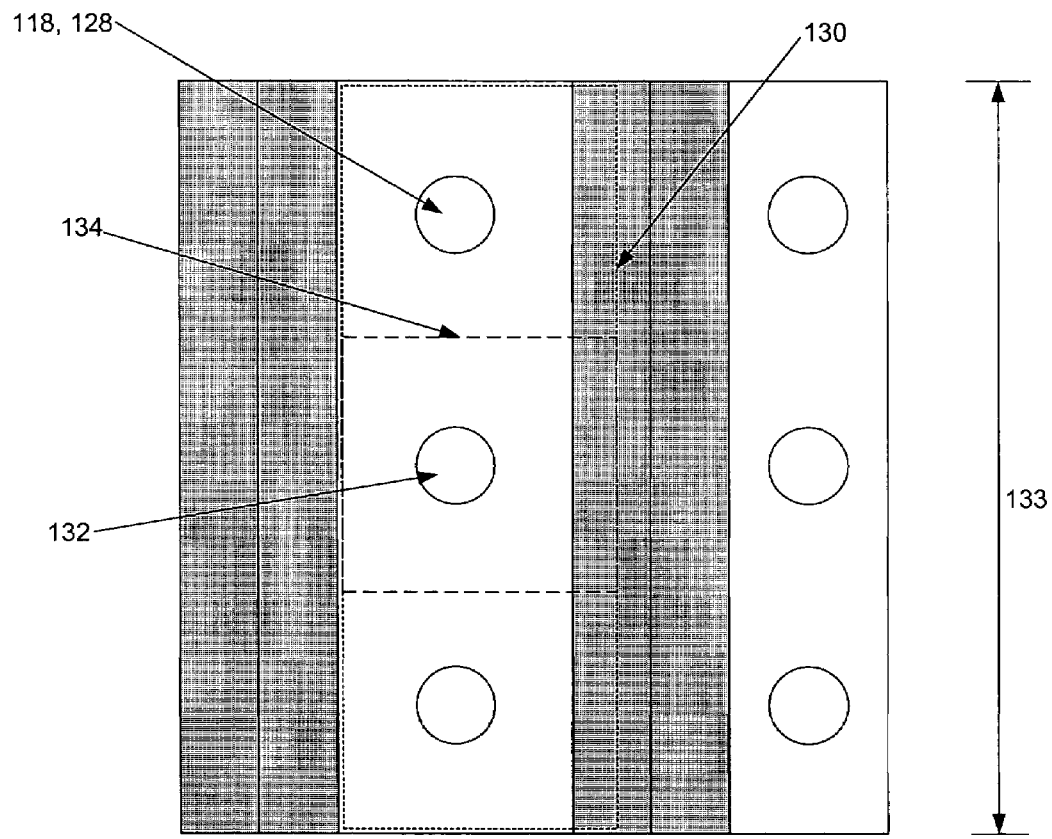

Referring to FIG. 1G, a notion of allocated volume of sacrificial dielectric material, per exhaust vent, is introduced. The microelectronic structure, shown in top view cross section, via a plane perpendicular to that of the plane of FIG. 1F, has three exhaust vents spaced apart approximately equally. In this variation, each exhaust vent (118) has a substantially cylindrical (128) three-dimensional geometry, as may be achieved using conventional etching procedures such as those employed for creating via trenches having substantially circular geometries. A representation of the total sacrificial dielectric material volume is outlined with a dashed line (130). A line of larger dashes (134) outlines approximately ⅓ of such volume (130), which is associated by geometry and fluid dynamics, assuming similar associated materials and processing schedules, with the center vent (132). The sacrificial material allocatable to the center vent (132) should be at least the same volume as the volume defined by the vent itself, in this case a cylindrical vent volume (128), or the chances of occlusion during the aforementioned processing is unlikely. In other words, the sacrificial material allocatable based upon factors such as heating, geometry, and fluid dynamics factors, must be voluminous enough to fill the vent volume, or occlusion may not be accomplished. Fluid dynamics factors, such as greater fluid pass-through restriction in certain adjacent vents, geometric factors, such as nonuniform vent geometry, or nonuniform heating and/or cooling, are likely to have significant affect on such a model, as would be obvious to one skilled in the art. Adjacent vent geometries preferably are substantially uniform, as is thermodynamic treatment and relevant geometry, and exhaust vents with substantially cylindrical shapes preferably have diameters between about 200 nanometers and about 500 nanometers. Substantially complete occlusion may be preferable for structural integrity of the layer comprising the second dielectric layer and associated plugs, and may also be preferred for sealing the voids (144) created from other surrounding materials and environmental factors.

Figure 1H:
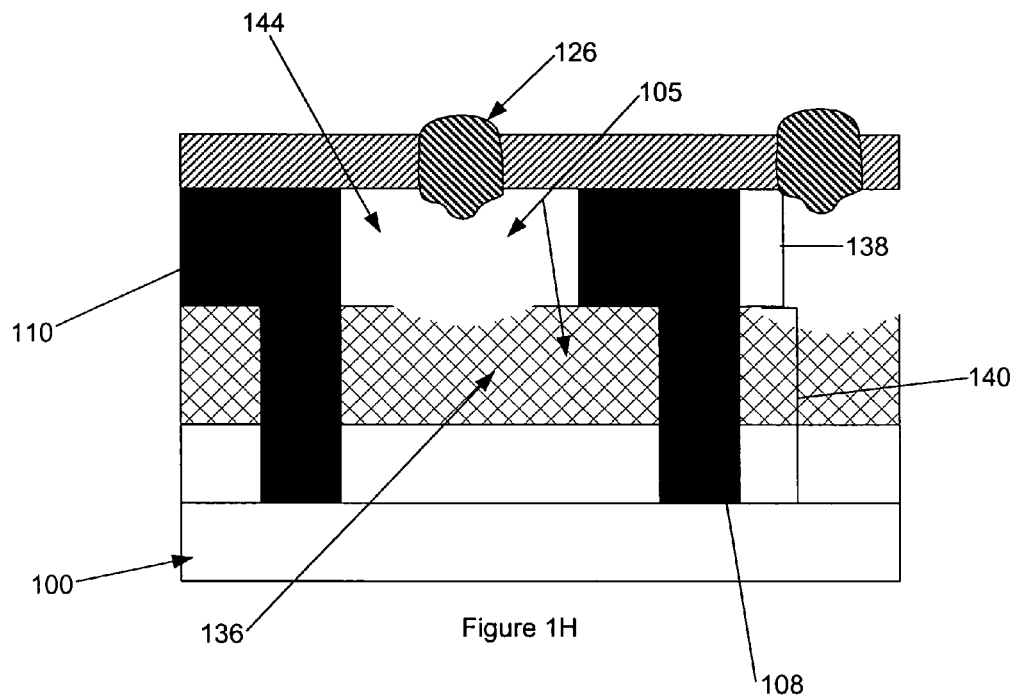

Referring to FIGS. 1H and 1L, two variations of an embodiment of the invention wherein some residual sacrificial dielectric material (136, 142) remains located in the volume previously occupied (105) by the intact sacrificial layer (104 in FIGS. 1A-1D). Such residual sacrificial dielectric material generally is the result of an allocatable volume of sacrificial dielectric material which is larger than that which is needed to form a plug (126) in the pertinent vent.

As shown in FIG. 1H, the residual sacrificial dielectric material (136) forms a layer positioned between the first dielectric layer (102) and a void (144), and between the two conductive layers (108, 110), the layer being substantially segregated from the void (144) within the volume previously occupied by the intact sacrificial dielectric layer (104 in FIGS. 1A-1D), and being formed as a result of a plasma-assisted thermal decomposition wherein a portion of the sacrificial dielectric material is dry etched during heating, which improves reactivity with the carrier plasma and creates a relatively low temperature thermal decomposition, at a temperature not substantially greater than the thermal decomposition temperature for the sacrificial dielectric material. With such as scenario, the plasma reacts with the most immediately exposed surfaces of the sacrificial dielectric material (136) first, creating a concave surface into the residual sacrificial dielectric material (136) as shown, then gradually works through the first dielectric layer (102) toward the substrate layer (100), producing volatile gas (199 in FIG. 1E), which escapes and concomitantly contributes to the formation of a plug (126). The layer formed by the residual sacrificial dielectric material (136) preferably is between about 10 nanometers and about 1,000 nanometers with such an embodiment. As shown in FIG. 1H, portions of the residual sacrificial dielectric material (136) may be substantially aligned with the via portions (140) of the conductive members, while the void (144) is substantially aligned with the line portions (138). Such a construction may be desirable since the via portions, relatively unstable due to their geometry, are supported by adjacent solid material, and since the highly conductive line portions (138) are positioned adjacent the low-k dielectric properties of the void (144).

Figure 1I:
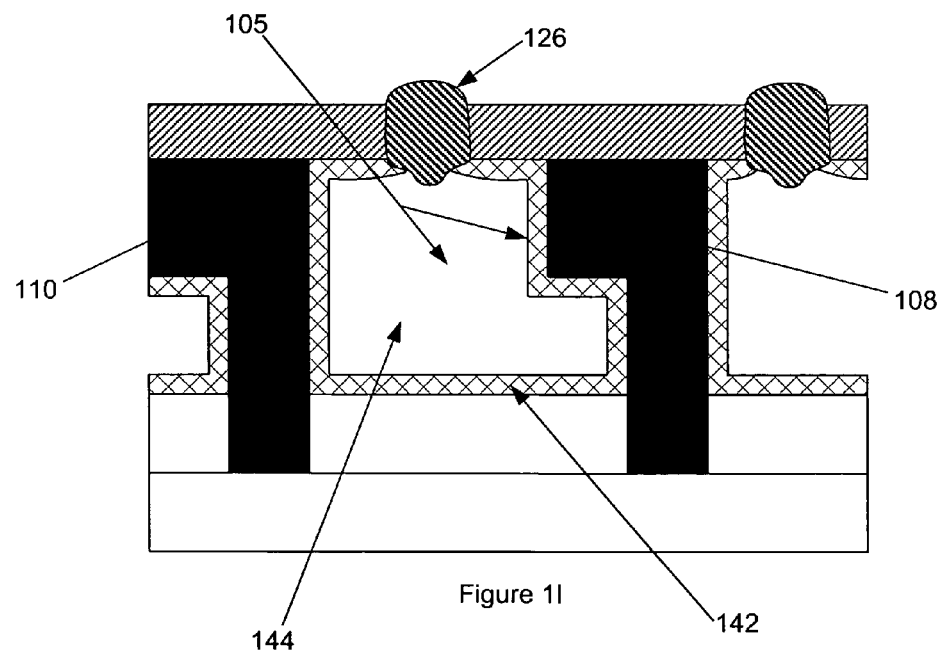

Referring to FIG. 1I, a variation is depicted wherein the residual sacrificial dielectric material (142), substantially segregated from the void (144) within the volume previously occupied by the intact sacrificial dielectric layer (104 in FIGS. 1A-1D), is positioned substantially evenly about the borders of the volume, preferably with a thickness between about 10 nanometers and about 100 nanometers. Such a variation may be formed by rapidly quenching a thermally-driven volatile gas (199 in FIG. 1E) to room temperature in a manner wherein portions of the volatile gas condensate upon the adjacent solid surfaces, such as the surfaces of conductive layers and other dielectric layers, because the adjacent solid surfaces would cool faster than the region no longer occupied by a solid. A centrally located air gap (144) results, providing low-k dielectric benefits along the associated lengths of conductive members (108, 110), as well as some support of the associated structures through the thin layer comprising the residual sacrificial dielectric material (142).

Figure 2A:
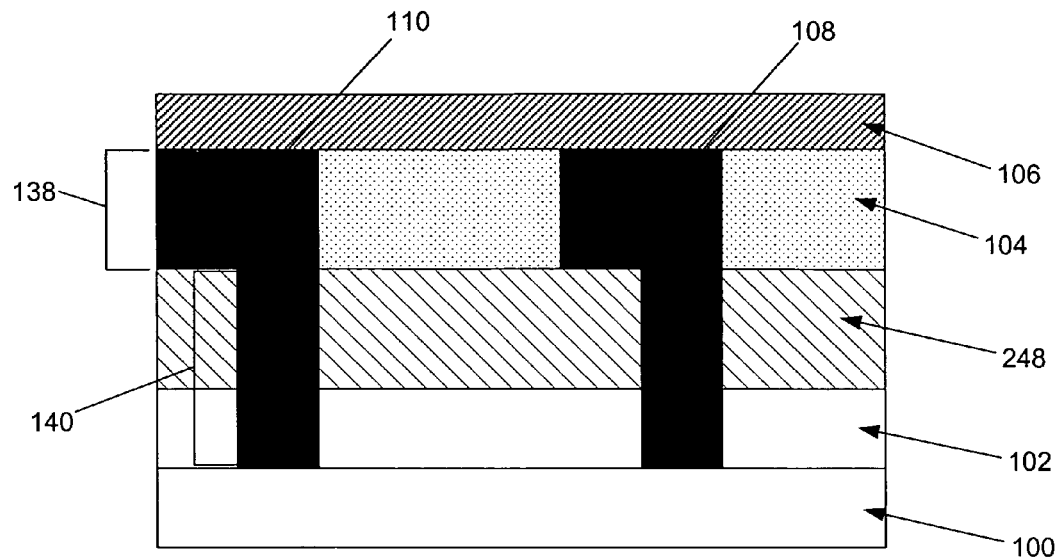
FIGS. 2A-2H depict cross-sectional views of various aspects of another embodiment of the present invention having at least one additional dielectric layer disposed between the sacrificial dielectric layer and the substrate layer.
Figure 2B:
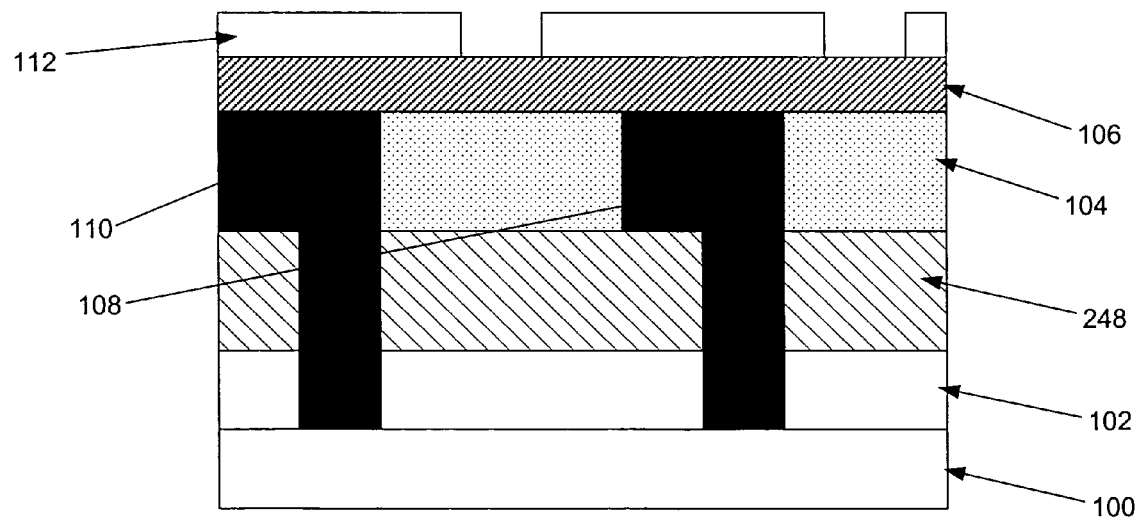
Figure 2C:
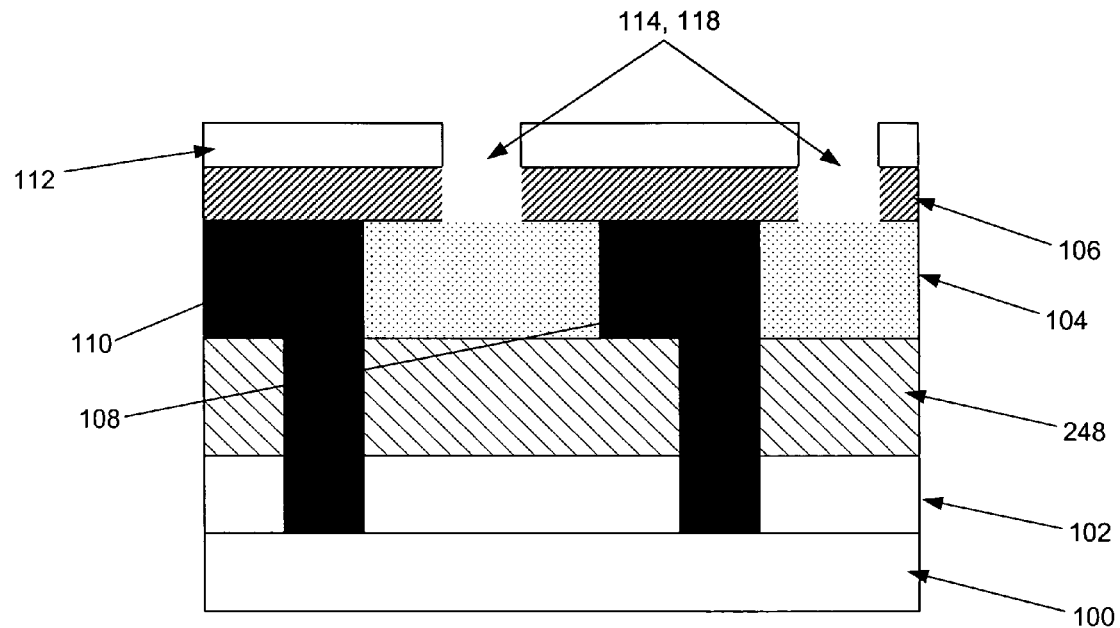
Figure 2D:
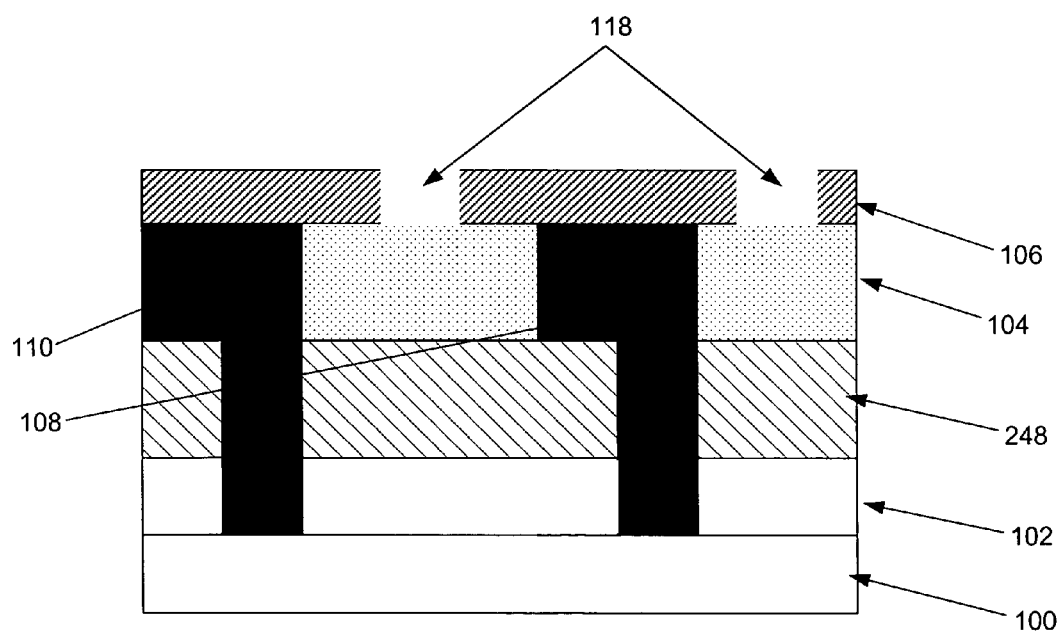

Referring to FIGS. 2A-2H, an analog of the structures and processes described in reference to FIG. 1 are presented, with FIGS. 2A-2H paralleling FIGS. 1A-1F and 1H-1I and like references indicating similar elements. Referring to FIG. 2A, the depicted structure varies from that of FIG. 1A in that a third dielectric layer (248) is disposed between the first dielectric layer (102) and the sacrificial dielectric layer (104), which is decreased in geometry in this variation to provide room for the third dielectric layer (248). In the depicted variation, the third dielectric layer (248) is positioned adjacent via portions (140) of the conductive layers and not adjacent to the line portions (138). In a similar manner as with the residual sacrificial dielectric material (136) of FIG. 1H, such a geometric configuration may be desirable because support is provided to the narrowed via portions (140), which may be more susceptible to undesirable bending or deformation due to their smaller relative size, while the highly-conductive line portions (138) are more likely surrounded by a void or voids resulting from the decomposition and removal of a portion of the sacrificial dielectric layer (104).

The third dielectric layer (248) may comprise any material that may insulate one conductive layer from another, and preferably comprises a dielectric material having a higher thermal decomposition temperature than that of the sacrificial dielectric layer (104) with which it is paired. For example, the third dielectric layer may comprise silicon dioxide (either undoped or doped with phosphorus or boron and phosphorus); silicon nitride; silicon oxy-nitride; porous oxide; an organic containing silicon oxide; fluorine silicate glass ("FSG"), or a polymer. Preferred are polymers or carbon doped oxides, as further described below, with a low dielectric constant: preferably less than about 3.5 and more preferably between about 1.5 and about 3.0. When other adjacent dielectric layers comprise materials having a low dielectric constants, the capacitance between various conductive elements that are separated by such layers should be reduced, when compared to the capacitance resulting from use of other conventionally used dielectric materials such as silicon dioxide. Such reduced capacitance may decrease the RC delay that would otherwise exist and may also decrease undesirable cross-talk between conductive lines.

The third dielectric layer (248) may comprise an organic polymer selected from the group consisting of polyimide, polyarylene, poly(aryl ether), organosilicate, polynaphthalene, and polyquinoline, or copolymers thereof. When the third dielectric layer (248) comprises a polymer, it is preferably formed by spin coating or chemical vapor depositing the polymer onto the surface of the first dielectric layer (102), using conventional equipment and process treatments.

The third dielectric layer (248) may alternatively comprise a compound having the molecular structure $Si_x O_y R_z$, in which R is selected from the group consisting of hydrogen, carbon, an aliphatic hydrocarbon and an aromatic hydrocarbon. When "R" is an alkyl or aryl group, the resulting composition is often referred to as carbon-doped oxide ("CDO"). When the third dielectric layer (248) comprises a carbon-doped oxide, it preferably comprises between about 5 and about 50 atom % carbon. More preferably, such a compound includes about 15 atom % carbon.

Examples of other types of materials that may be used to form the third dielectric layer (248) include aerogel, xerogel, and spin-on-glass ("SOG"). In addition, the third dielectric layer (248) may comprise either hydrogen silsesquioxane ("HSQ"), methyl silsesquioxane ("MSQ"), or other materials having the molecular structure specified above, which may be coated onto the surface of a semiconductor wafer using a conventional spin coating process. Although spin coating may be a preferred way to form the third dielectric layer (248) for some materials, for others chemical vapor deposition, plasma enhanced chemical vapor deposition, a SolGel process, or foaming techniques may be preferred. The third dielectric layer (248) preferably has a thickness between about 10 nanometers and about 500 nanometers.

Referring to Figures and 2B, after the third dielectric layer (248) has been formed adjacent the first dielectric layer, subsequent formation of the sacrificial dielectric layer (104), conductive layers (108, 110), second dielectric layer (106), and etching pattern layer (112) proceeds as described above using conventional techniques. In reference to FIGS. 2C and 2D, trenching (114) to define each vent (118) also proceeds as described above.

Figure 2E:
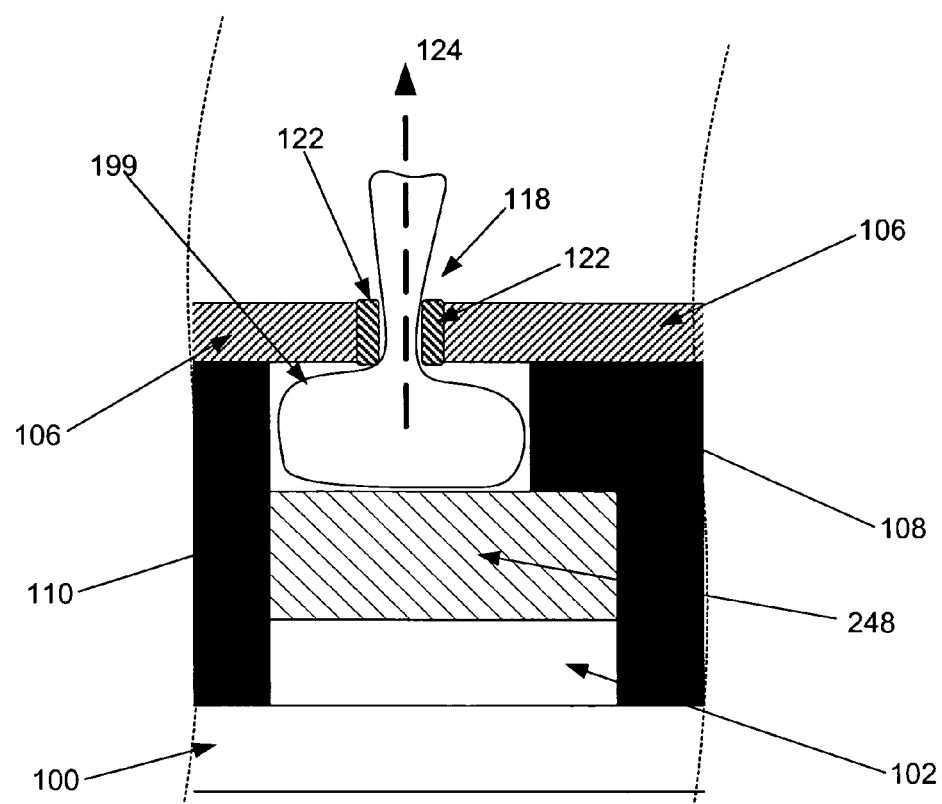
Figure 2F:
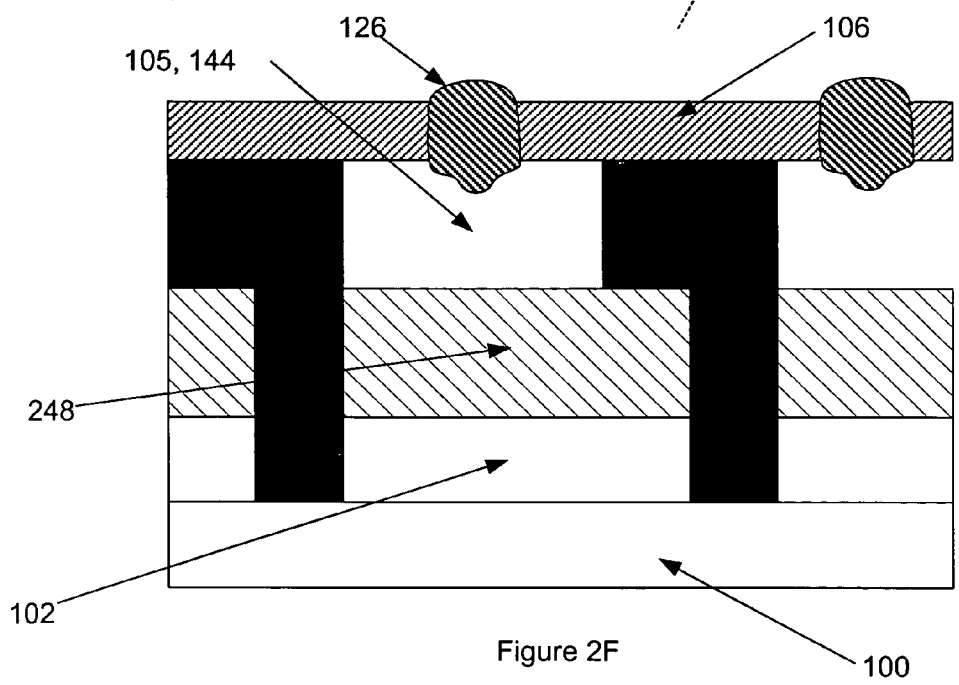
Figure 2G:
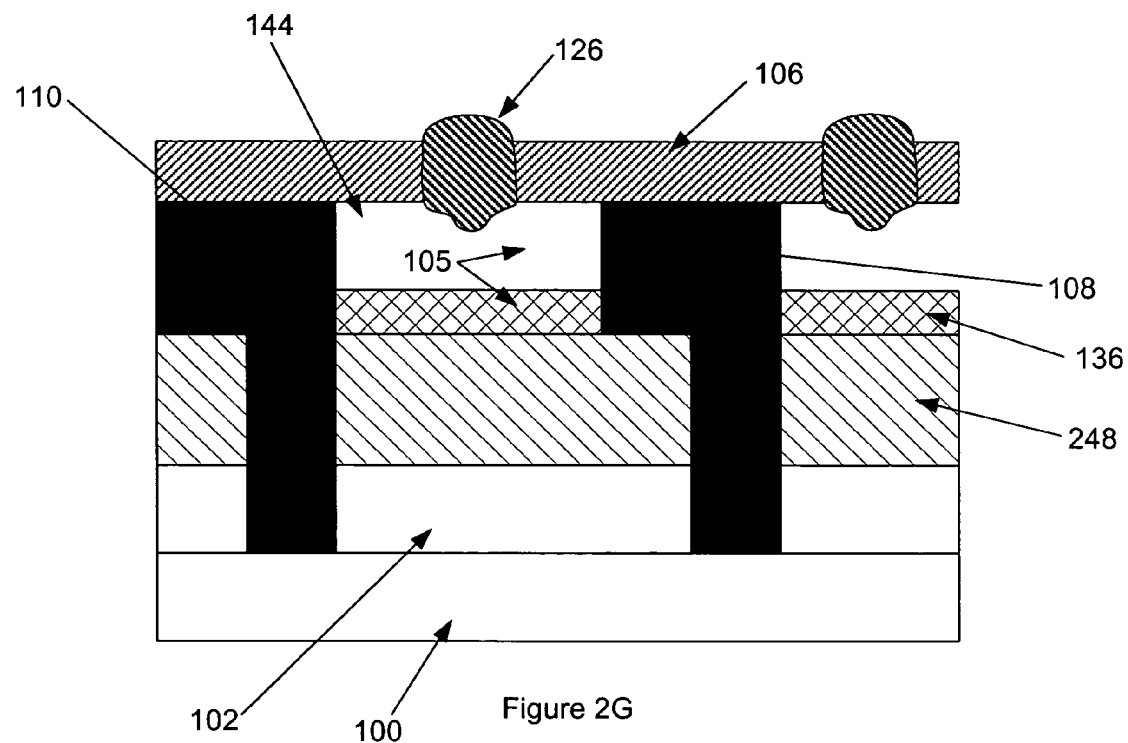
Figure 2H:
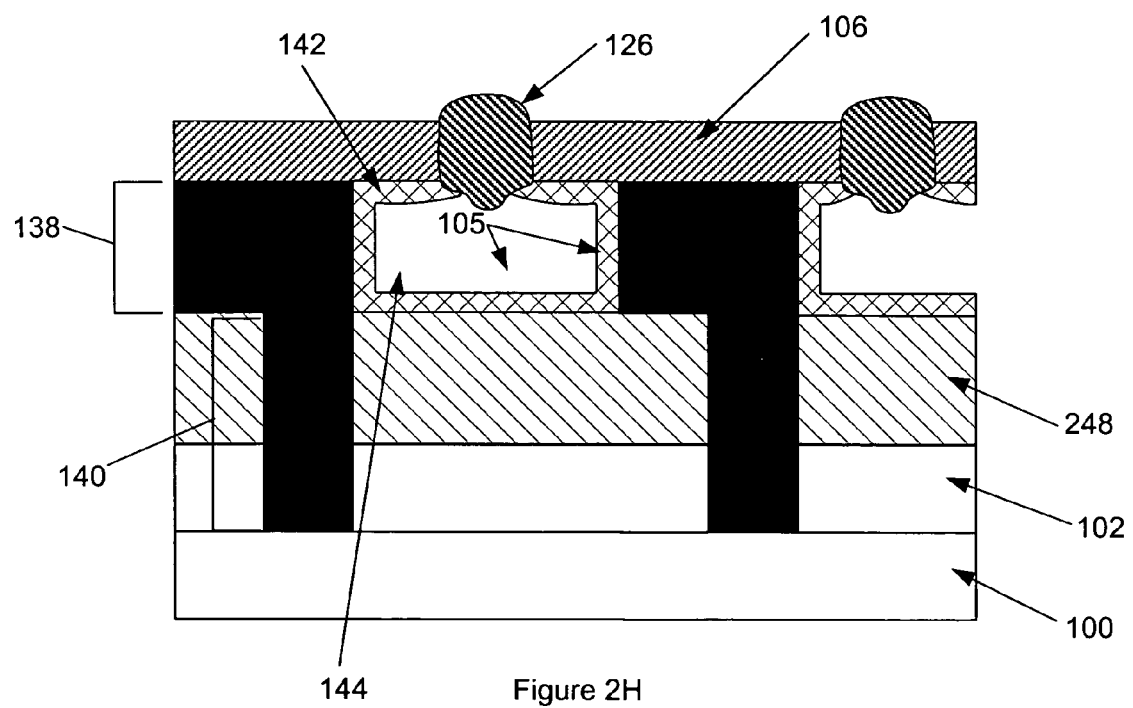

As depicted in FIG. 2E, subsequent to thermal decomposition of at least a portion of the sacrificial dielectric layer (104), and introduction of a carrier plasma (not shown), such as a hydrogen, nitrogen, or oxygen rich plasma, a volatile gas is formed (199) which escapes during cooling, forming residue (122) around the exhaust vent (118), to preferably result in a structure such as that depicted in FIG. 2F, wherein at least one void (144) is positioned within the volume previously occupied (105) by the sacrificial dielectric material, the void being isolated by a plug (126) through the second dielectric layer (106) from the environment opposite the second dielectric layer (106). In a similar manner to that of the variations of FIGS. 1H and 1I, residual portions (136, 142) may continue to occupy portions of the volume previously occupied (105) by the intact sacrificial dielectric layer (104), and may form shapes such as those depicted in FIGS. 2G and 2H (136, 142, respectively).

Thus, a novel dielectric solution is disclosed. Although the invention is described herein with reference to specific embodiments, many modifications therein will readily occur to those of ordinary skill in the art. Accordingly, all such variations and modifications are included within the intended scope of the invention as defined by the following claims.

The invention claimed is:

1. A method comprising:
    forming a cavity between a plurality of dielectric layers by thermally decomposing a sacrificial dielectric material through an exhaust vent in one of the dielectric layers; and
    substantially isolating the cavity by at least partially occluding the exhaust vent by accumulating a residue from the sacrificial dielectric material thermal decomposition.

2. The method of claim 1 wherein thermally decomposing the sacrificial dielectric material further comprises heating the dielectric material beyond its thermal decomposition temperature.

3. The method of claim 1 further comprising cooling the dielectric layers.

4. The method of claim 1 wherein thermally decomposing the sacrificial dielectric material further comprises exposing the sacrificial dielectric material to a carrier plasma.

5. The method of claim 4 further comprising dry etching a portion of the sacrificial dielectric material to improve reactivity with the carrier plasma.

6. The method of claim 4 wherein the carrier plasma includes a gas selected from the group consisting of oxygen, hydrogen, and nitrogen.

7. The method of claim 1 wherein the residue plugs the exhaust vent.

8. The method of claim 1 wherein the sacrificial dielectric material is an organic polymer.

9. The method of claim 8 wherein the organic polymer is selected from the group consisting of polynorbornene, crosslinked photoresist, photosensitive polyimide, polyarylene, and poly(aryl ether).

10. The method of claim 1 wherein the dielectric layer including the exhaust vent is a ceramic material.

11. The method of claim 10 wherein the dielectric layer including the exhaust vent is a material selected from the group consisting of silicon nitride, silicon carbide, silicon dioxide, carbon doped oxide, and aluminosilicate.

12. The method of claim 1 wherein the residue is the same material as the sacrificial dielectric material.

13. The method of claim 1 wherein accumulating said residue from the sacrificial dielectric material thermal decomposition further comprises depositing a layer of residue on the walls of said cavity.

14. The method of claim 1 wherein thermally decomposing said sacrificial dielectric material comprises retaining at least a portion of said sacrificial dielectric material.

15. A method comprising:
    forming a cavity above a first dielectric layer and below a second dielectric layer by thermally decomposing a sacrificial dielectric material through an exhaust vent in said second dielectric layer, wherein said first dielectric layer acts as an etch stop during the formation of said cavity; and
    substantially isolating said cavity by at least partially occluding said exhaust vent by accumulating a residue formed from thermally decomposing said sacrificial dielectric material.

16. The method of claim 15 wherein thermally decomposing said sacrificial dielectric material comprises exposing said sacrificial dielectric material to a carrier plasma.

17. The method of claim 16 further comprising dry etching a portion of said sacrificial dielectric material to improve reactivity with said carrier plasma.

18. The method of claim 15 wherein said residue plugs said exhaust vent.

19. The method of claim 15 wherein said sacrificial dielectric material is an organic polymer.

20. The method of claim 15 wherein thermally decomposing said sacrificial dielectric material comprises retaining at least a portion of said sacrificial dielectric material.

* * * * *